(12) United States Patent
Yamamoto et al.

(10) Patent No.: US 12,422,860 B2
(45) Date of Patent: Sep. 23, 2025

(54) MAGNETIC MARKER SYSTEM AND MAGNETIC MARKER SYSTEM DESIGNING METHOD

(71) Applicant: Aichi Steel Corporation, Tokai (JP)

(72) Inventors: Michiharu Yamamoto, Tokai (JP); Tomohiko Nagao, Tokai (JP); Hitoshi Aoyama, Tokai (JP)

(73) Assignee: AICHI STEEL CORPORATION, Tokai (JP)

( * ) Notice: Subject to any disclaimer, the term of this patent is extended or adjusted under 35 U.S.C. 154(b) by 254 days.

(21) Appl. No.: 18/284,878

(22) PCT Filed: Mar. 23, 2022

(86) PCT No.: PCT/JP2022/013690
§ 371 (c)(1),
(2) Date: Sep. 29, 2023

(87) PCT Pub. No.: WO2022/210203
PCT Pub. Date: Oct. 6, 2022

(65) Prior Publication Data
US 2024/0183118 A1    Jun. 6, 2024

(30) Foreign Application Priority Data
Apr. 1, 2021 (JP) .................................. 2021-062795

(51) Int. Cl.
*G05D 1/244* (2024.01)
*E01F 9/30* (2016.01)
(Continued)

(52) U.S. Cl.
CPC .............. *G05D 1/244* (2024.01); *E01F 9/30* (2016.02); *H01F 7/0205* (2013.01); *G05D 2105/28* (2024.01)

(58) Field of Classification Search
CPC ....... E01F 9/30; G05D 1/244; G05D 2105/28; G05D 2107/70; G05D 2109/10;
(Continued)

(56) References Cited

U.S. PATENT DOCUMENTS

| 2015/0168583 A1 | 6/2015 | Hautson et al. |
| 2015/0247719 A1 | 9/2015 | Huang et al. |

(Continued)

FOREIGN PATENT DOCUMENTS

| JP | H08-271269 A | 10/1996 |
| JP | 2001125638 A | * 5/2001 |

(Continued)

OTHER PUBLICATIONS

International Search Report and Written Opinion mailed on May 31, 2022, received for PCT Application PCT/JP2022/013690, filed on Mar. 23, 2022, 10 pages including English Translation.

*Primary Examiner* — Mohamad A Musleh
(74) *Attorney, Agent, or Firm* — XSENSUS LLP

(57) ABSTRACT

In a designing method for setting a specification of an individual-piece magnetic marker to be laid on a road surface, a specification of the magnetic marker is appropriately set based on a correlation coefficient between a first distribution of strengths of magnetism in a forwarding direction acting on a position at a minimum attachment height in a range of attachment heights of the magnetic sensor assumed in respective vehicles and a second distribution representing a distribution of strengths of magnetism in the forwarding direction acting on the position at the minimum attachment height when magnetism is assumed to be generated from a one-point magnetism generation source.

20 Claims, 15 Drawing Sheets

(51) Int. Cl.
*H01F 7/02* (2006.01)
*G05D 105/28* (2024.01)

(58) Field of Classification Search
CPC .. G05D 1/646; H01F 7/0205; G01R 33/0094;
G01R 33/06; G01R 33/063; G01R 33/02
See application file for complete search history.

(56) References Cited

U.S. PATENT DOCUMENTS

| | | |
|---|---|---|
| 2018/0305874 A1 | 10/2018 | Yamamoto et al. |
| 2019/0098468 A1 | 3/2019 | Yamamoto et al. |
| 2022/0389239 A1 | 12/2022 | Oota |

FOREIGN PATENT DOCUMENTS

| | | | | |
|---|---|---|---|---|
| JP | 3834926 B2 | 10/2006 | | |
| JP | 2008-281556 A | 11/2008 | | |
| JP | 2015-129748 A | 7/2015 | | |
| JP | 2017-078910 A | 4/2017 | | |
| JP | 2017078909 A | * 4/2017 | ............ | G08B 21/00 |
| JP | 2018-071340 A | 5/2018 | | |
| JP | 2019-137521 A | 8/2019 | | |
| WO | 2017/187881 A1 | 11/2017 | | |
| WO | 2021/106660 A1 | 6/2021 | | |

\* cited by examiner

MAGNETIC MARKER SYSTEM AND MAGNETIC MARKER SYSTEM DESIGNING METHOD

CROSS-REFERENCE TO RELATED APPLICATIONS

The present application is based on PCT filing PCT/JP2022/013690, filed Mar. 23, 2022, which claims priority from Japanese Patent Application No. 2021-062795, filed Apr. 1, 2021, the entire contents of each are incorporated herein by reference.

TECHNICAL FIELD

The present invention relates to a magnetic marker system in which magnetic markers are laid on or in a traveling road and a magnetic marker system designing method.

BACKGROUND ART

Conventionally, a magnetic marker system including magnetic markers laid on or in a traveling road for a vehicle has been known (for example, refer to Patent Literatures 1 and 2). In the magnetic marker system, the magnetic markers are used to automate movement of the vehicle and assist driving of the vehicle. The vehicle using the magnetic marker system includes, for example, a magnetic sensor attached to the bottom surface of the vehicle body to magnetically detect a magnetic marker laid on or in the road surface.

Vehicles using the magnetic marker system may have variation and the attachment height of the magnetic sensor may vary. In this case, a difference in the degree of difficulty in detecting a magnetic marker occurs in accordance with the attachment height of the magnetic sensor. As the attachment height of the magnetic sensor is higher, the degree of detection difficult tends to be higher.

CITATION LIST

Patent Literatures

Patent Literature 1: Japanese Unexamined Patent Application Publication No. 2017-078910
Patent Literature 2: Japanese Unexamined Patent Application Publication No. 2019-137521

SUMMARY OF INVENTION

Technical Problem

The above-described conventional magnetic marker system has a problem as described below. That is, when the attachment height of the magnetic sensor varies depending on the type of vehicle, there is a problem in which it is difficult to make a determination in setting a specification of the magnetic marker.

The present invention was made in view of the above-described conventional problem, and is to provide a magnetic marker system in which a specification of a magnetic marker is appropriately set, and a magnetic marker system designing method for appropriately setting a specification of a magnetic marker.

Solution to Problem

One mode of the present invention resides in a magnetic marker system in which a magnetic marker as an individual-piece magnet or a columnar-shaped magnet is laid on or in a road surface forming a surface of a traveling road so as to be able to be detected by a vehicle including a magnetic sensor, with an attachment height of the magnetic sensor with reference to the road surface varying depending on a type of the vehicle, wherein a specification of the magnetic marker as the individual-piece magnet is set based on a degree of approximation between a first distribution representing a distribution of strengths of magnetism in a radial direction of the magnetic marker acting on a position at a minimum attachment height in a range of attachment heights of the magnetic sensor assumed in respective vehicles, and a second distribution representing a distribution of strengths of magnetism in a direction equivalent to the radial direction of the magnetic marker acting on the position at the minimum attachment height when the magnetic marker as a magnetism generation source is replaced by a magnetic dipole.

One mode of the present invention resides in a magnetic marker system designing method of, when a magnetic marker as an individual-piece magnet or a columnar-shaped magnet is laid on or in a road surface forming a surface of a traveling road so as to be able to be detected by a vehicle including a magnetic sensor, setting a specification of the magnetic marker, with an attachment height of the magnetic sensor with reference to the road surface varying depending on a type of the vehicle, the method comprising setting the specification of the magnetic marker as the individual-piece magnet is set based on a degree of approximation between a first distribution representing a distribution of strengths of magnetism in a radial direction of the magnetic marker acting on a position at a minimum attachment height in a range of attachment heights of the magnetic sensor assumed in respective vehicles, and a second distribution representing a distribution of strengths of magnetism in a direction equivalent to the radial direction of the magnetic marker acting on the position at the minimum attachment height when the magnetic marker as a magnetism generation source is replaced by a magnetic dipole.

Advantageous Effects of Invention

The magnetic marker system according to the present invention is a system designed in consideration of the first distribution representing the distribution of strengths of magnetism acting on the position at the minimum attachment height in the range of attachment heights of the magnetic sensor. In this magnetic marker system, a specification of the magnetic marker as an individual-piece magnet or a columnar-shaped magnet is set based on the degree of approximation between the second distribution representing the distribution of strengths of magnetism acting on the position at the minimum attachment height when the magnetic marker as a magnetism generation source is replaced by a magnetic dipole and the above-described first distribution. According to the magnetic marker system designing method in accordance with the present invention, the specifications of the magnetic marker can be appropriately set in accordance with the minimum attachment height of the magnetic sensor, which is a specification on a magnetic sensor side.

DESCRIPTION OF EMBODIMENTS

Figure 1:
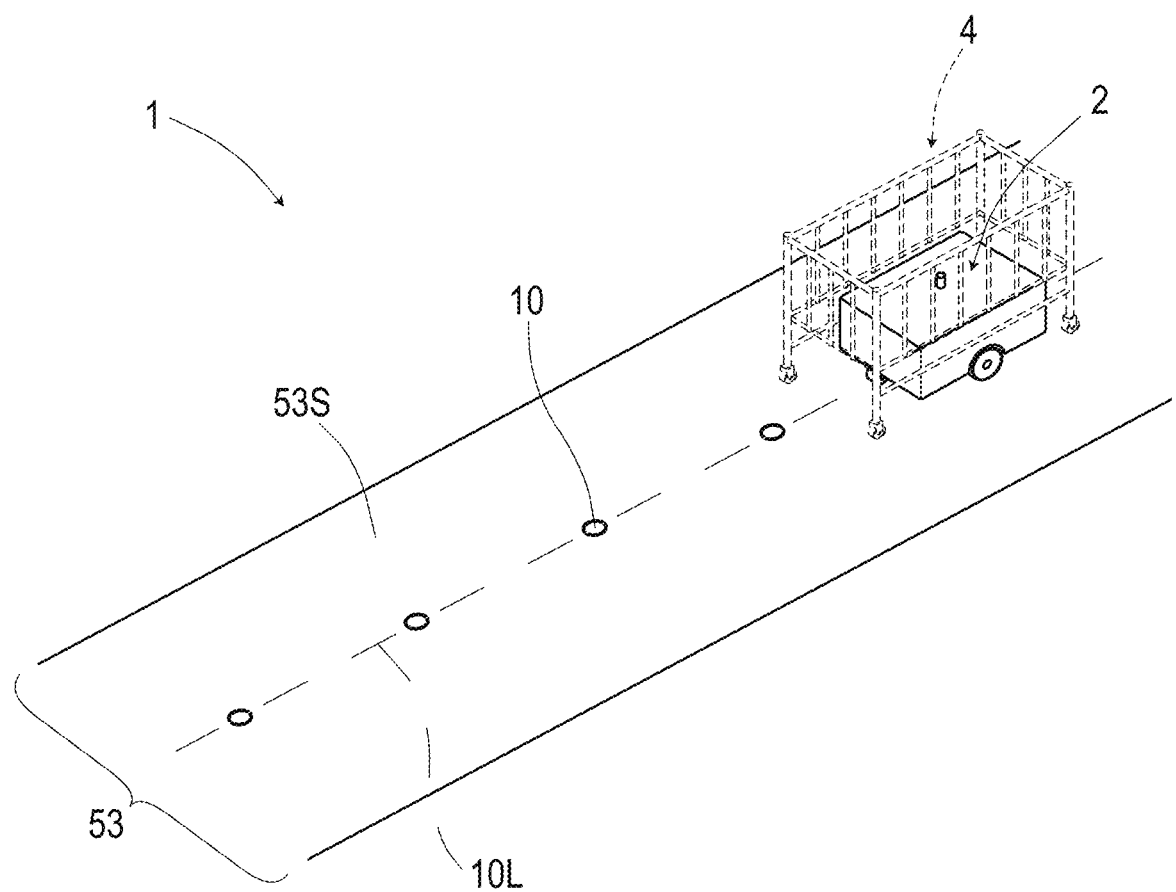
FIG. 1 is a descriptive diagram of a magnetic marker system.

A magnetic dipole means a pair of positive and negative magnetic poles. And, a magnetic distribution around the magnetic dipole means a distribution of strengths of magnetism formed by the pair of positive and negative magnetic poles. The magnetic distribution around the magnetic dipole is a magnetic distribution in which the magnetic poles forming the magnetic dipole is positioned at its center, irrespective of the mass (area) of the magnetic poles forming the magnetic dipole. The magnetic distribution of the magnetic dipole can be said as an ideal magnetic distribution when the magnetic poles are taken as not having mass and magnetic lines of force flow from one point forming the center of each magnetic pole. In an actual magnet, the positive and negative magnetic poles are not points and each have mass. The shapes of the actual magnetic lines of force flow from the positive and negative magnetic poles of the actual magnet having mass fluctuate in accordance with the mass of the magnetic poles. As the mass of the magnetic pole is larger, a deviation from the magnetic lines of force flow from the magnetic poles as points not having mass (area) is larger. A case in which the magnetic marker as a magnetism generation source is replaced by a magnetic dipole means a case in which it is assumed that magnetic force of the magnetic marker is generated from the center of the magnetic pole of the magnetic marker.

For vehicles passing through a public road (one example of a traveling road), the specifications of a lowest ground height are defined in advance by, for example, regulations regarding road traffic. Since a magnetic sensor cannot be attached at a height below the lowest ground height of vehicles, the lowest ground height of each vehicle is the lowest height at which a magnetic sensor can be attached. For example, for vehicles for private use, the lowest ground height varies depending on the vehicle type (type of the vehicle), such as a sportscar, sedan, or SUV. For example in Japanese traffic regulations, the lowest ground height is defined as 90 mm or higher. On the other hand, the lowest ground height of work vehicles for use in load carriage and so forth tend to high. For example, the lowest ground height of vehicles such as dump trucks for carrying sand and so forth reaches near 250 mm. For example, for vehicles passing through Japanese roads, the attachment height of the magnetic sensor is in a range on the order of 90 mm to 250 mm.

For vehicles moving inside facilities such as factories, such as unattended carrier vehicles (AGV, Automated Guided Vehicle), the true state is that the traveling speed of these vehicles is relatively slow compared with vehicles passing through public roads. Also, the true state is that management, such as maintenance, of passages in factories is relatively easy compared with public roads. For this reason, for vehicles moving only on passages in factories, the lowest ground height can be set lower, and the magnetic sensor can be attached at a lower position.

In factories, a wide variety of components and materials are handled, and ways of carrying components and materials also widely vary. In some factories, various unattended carrier vehicles are used to carry various components and materials. Even in unattended carrier vehicles, the lowest ground height can vary for each type of vehicle. Therefore, even in a magnetic marker system for unattended carrier vehicles, it is required in system design to consider variation in attachment height of the magnetic sensor.

The magnetic marker is an individual-piece magnet or a columnar-shaped permanent magnet. The magnet itself may be a magnetic marker, or a magnetic marker may have a layer formed of a coating layer, resin mold layer, or composite material, or the like provided on part of a surface of the magnet. The surface of the magnet where these layers are provided may be all surfaces, a front surface, a rear surface, or an outer circumferential surface.

Note that, as magnetism acting at the minimum attachment height of the magnetic sensor, for example, magnetic components in a vertical direction, magnetic components in a forwarding direction corresponding to a longitudinal direction of the vehicle, or magnetic components in a left-right direction corresponding to a width direction of the vehicle may be adopted. As for magnetic components in the vertical direction and the width direction, when the magnetic marker is replaced by a magnetic dipole, a distribution of strengths of magnetism in a direction equivalent to the radial direction of the magnetic marker (second distribution) becomes a distribution close to a normal distribution. As for magnetic components in the forwarding direction, this distribution becomes a distribution close to a sinusoidal waveform.

EMBODIMENTS

First Embodiment

The present embodiment is an example regarding magnetic marker system 1 in which a vehicle such as unattended carrier vehicle 2 moves by using magnetic marker 10. Details of this are described with reference to FIG. 1 to FIG. 15.

Magnetic marker system 1 (FIG. 1) is a system introduced to a factory using unattended carrier vehicle 2. In the factory, various production facilities such as production machines and production lines (omitted in the drawing) are installed. Between adjacent production facilities, passage (one example of a traveling road) 53 is provided for people to move, for components to be carried to be supplied to the production facilities, and for processed component to be carried.

On passage 53 in the factory, magnetic markers 10 for achieving autonomous movement of vehicles such as unattended carrier vehicle 2 and a circulating vehicle (omitted in the drawing) are arrayed. Magnetic markers 10 are individual-piece magnets, and are arrayed as spaced on road surface 53S forming a surface of passage 53. In magnetic marker system 1 of the present embodiment, the vehicle such as unattended carrier vehicle 2 moves along, for example, line 10L where magnetic markers 10 are arrayed, while detecting magnetic markers 10.

Figure 2:
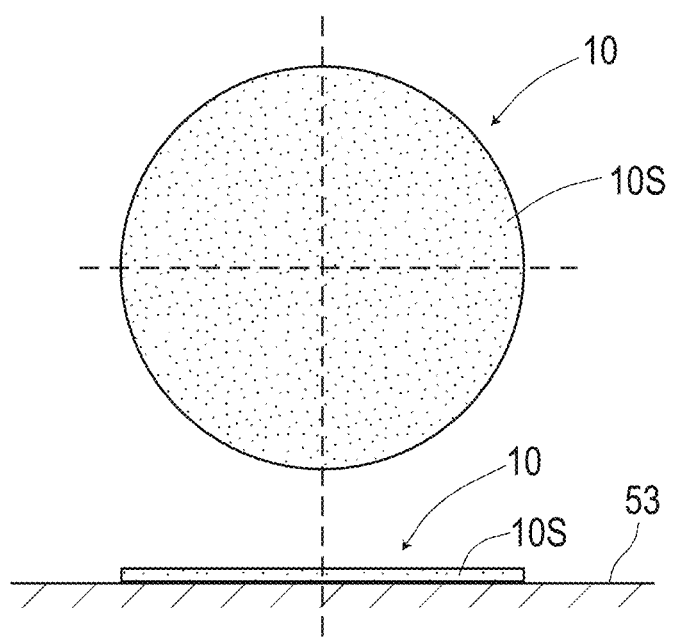
FIG. 2 depicts a top view and a side view of a magnetic marker.
Figure 3:
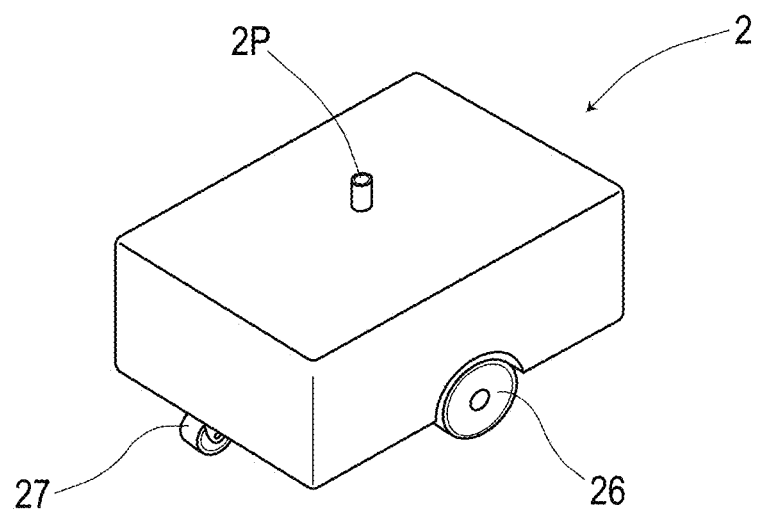
FIG. 3 is a perspective view depicting an unattended carrier vehicle.
Figure 4:
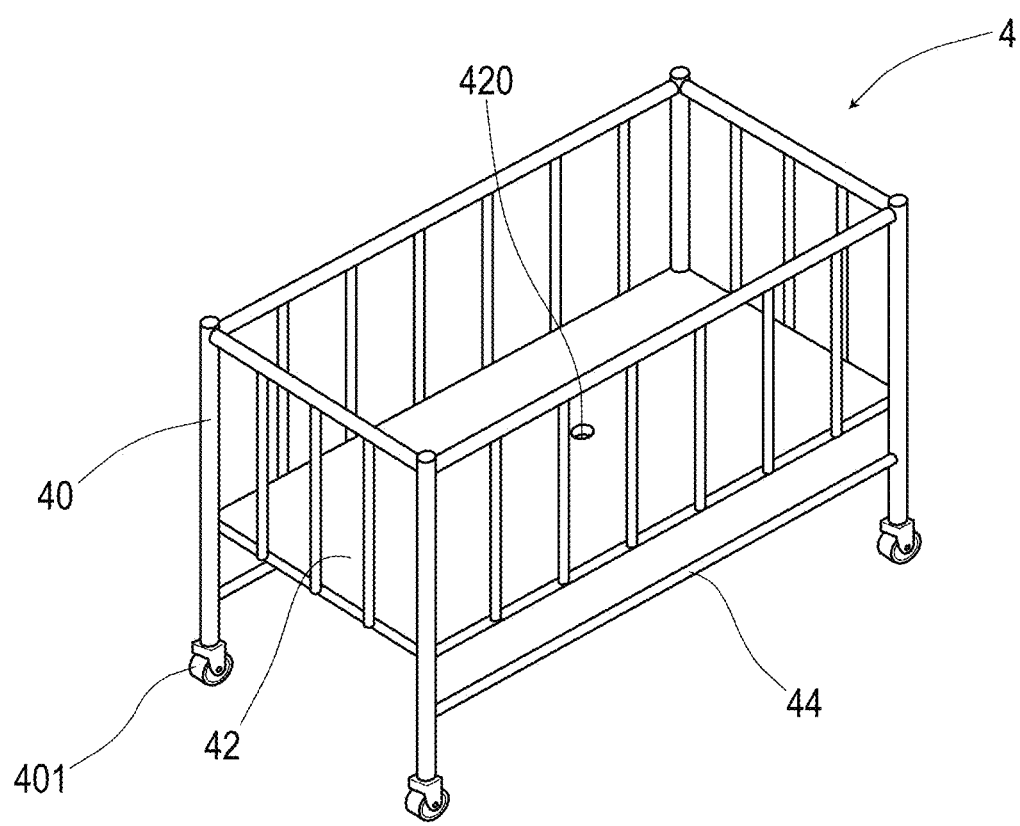
FIG. 4 is a perspective view depicting a carrier cage.

Magnetic marker 10 forms, as in FIG. 2, a sheet shape having a diameter of 50 mm and a thickness of 2.6 mm, and can be laminated on road surface 53S. Magnetic marker 10 is magnet sheet 10S itself, having a thickness of 2.6 mm. Note that a magnetic marker having a protective layer formed on a surface of magnet sheet 10S may be adopted. As a protective layer, for example, if a layer made of a composite material with glass fiber impregnated with resin is adopted, improvements in nonskid property and wear resistance can be achieved.

Magnet sheet 10S is a permanent magnet made of an isotropic ferrite rubber magnet formed in a sheet shape. The isotropic ferrite rubber magnet is a magnet with magnetic powder of iron oxide as a magnetic material dispersed into a polymer material as a base material. The maximum energy product (BHmax) of this magnet is 6.4 kJ/m$^3$.

Magnetic flux density Gs of the surface of this magnetic marker 10 is approximately 50 milliteslas. For example, a magnet sheet for use as being affixed to a whiteboard at an office or the like, a door of a refrigerator at home, or the like, a magnet sheet such as a newly-licensed-driver mark affixed to a vehicle body, or the like has a magnetic flux density of the surface on the order of 20 milliteslas to 40 milliteslas. Compared with these magnet sheets, the magnetic force generated from magnetic marker 10 of the present embodiment can be intuitively grasped as being a magnetic force that is so subtle disable to function as a general magnet that attracts metal bodies.

Note that, in place of magnetic marker 10 of the present embodiment, a magnetic marker with two magnet sheets (omitted in the drawing) laminated together may be adopted. In this case, a sheet-shaped RFID tag (Radio Frequency Identification Tag, wireless tag) may be interposed between the two magnet sheets. If the vehicle includes a tag reader, the RFID tag is operated by wireless power feed, and tag information such as position information can be acquired via wireless communication. Magnet sheet 10S is a sheet-shaped magnet with magnetic powder of iron oxide dispersed into a polymer material, and has electrical characteristics in which conductivity is low and an eddy current less tends to occur at the time of wireless power feed. In this case, the RFID tag can efficiently receive wirelessly-transferred power even in a state of being interposed between two magnet sheets 10S.

Unattended carrier vehicle 2 (FIG. 3) is an automotive vehicle to which carrier cage 4 (FIG. 4) can be coupled. Unattended carrier vehicle 2 has a box shape having a length of 50 cm, a width of 40 cm, and a height of 38 cm. Unattended carrier vehicle 2 can have carrier cage 4 coupled thereto for towing in a state of crawling under the floor of carrier cage 4 (refer to FIG. 1). On an upper surface of unattended carrier vehicle 2, coupling pin 2P capable of lifting and declining is provided. With this coupling pin 2P protruding upward, carrier cage 4 can be coupled.

Carrier cage 4 is a cart having a frame structure. Swivelabel wheel 401 is attached to a lower end of each of vertically directed main pipes 40 located at four corners. In carrier cage 4, by these four main pipes 40, bottom plate 42 for mounting components and so forth is supported. The height of bottom plate 42 is approximately 40 cm from road surface 53S. A space of a gap between road surface 53S and bottom plate 42 is a space where unattended carrier vehicle 2 crawls into a lower side. In bottom plate 42, insertion hole 420 for coupling pin 2P of unattended carrier vehicle 2 is bored.

In carrier cage 4, a cage-shaped mount space is formed by a frame of pipes on an upper side of bottom plate 42. On the lower side of bottom plate 42, horizontal guide bars 44 are provided at locations corresponding to both side surfaces of carrier cage 4. A space between left and right guide bars 44 is approximately 43 cm. When unattended carrier vehicle 2 is coupled, paired left and right guide bars 44 becomes in a state of interposing unattended carrier vehicle 2 having a width of 40 cm therebetween. Paired left and right guide pars 44 are useful for restricting relative rotation between carrier cage 4 and unattended carrier vehicle 2.

Figure 5:
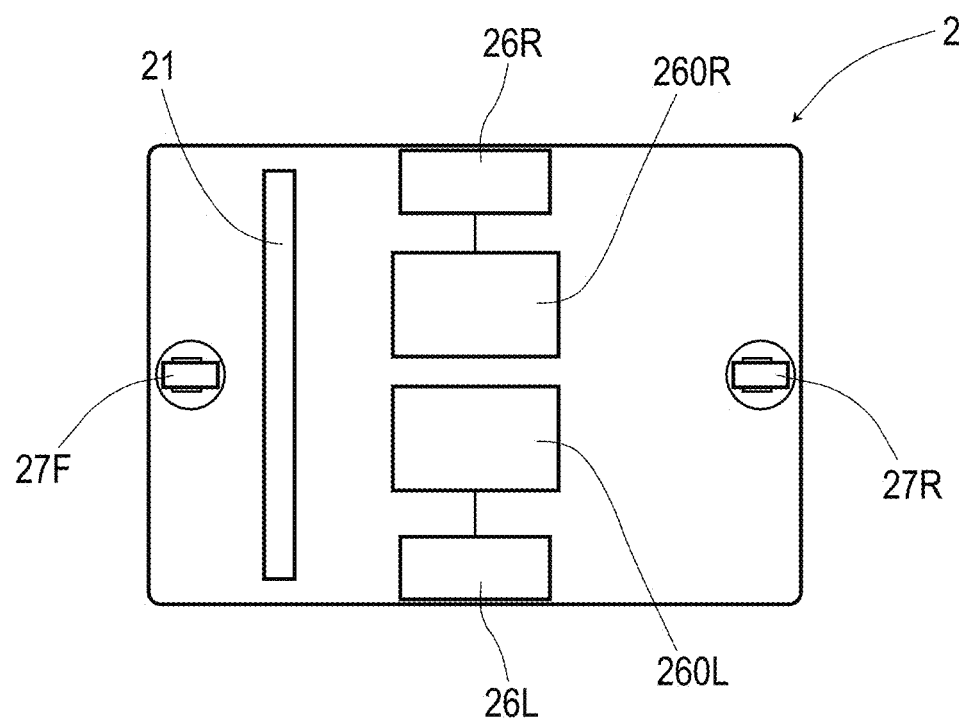
FIG. 5 is a bottom view of the unattended carrier vehicle.

Unattended carrier vehicle 2 includes, as in a bottom view of FIG. 5, paired left and right driving wheels 26L and 26R that can be individually controlled and paired front and rear swivelabel wheels 27F and 27R. Driving wheels 26L and 26R are rotationally driven individually by drive motors 260L and 260R, respectively. Also, in the longitudinal direction of the vehicle body, sensor array 21 for detecting magnetic marker 10 is arranged at a position corresponding to a location between swivelabel wheel 27F on a front side and paired left and right driving wheels 26L and 26R.

Figure 6:
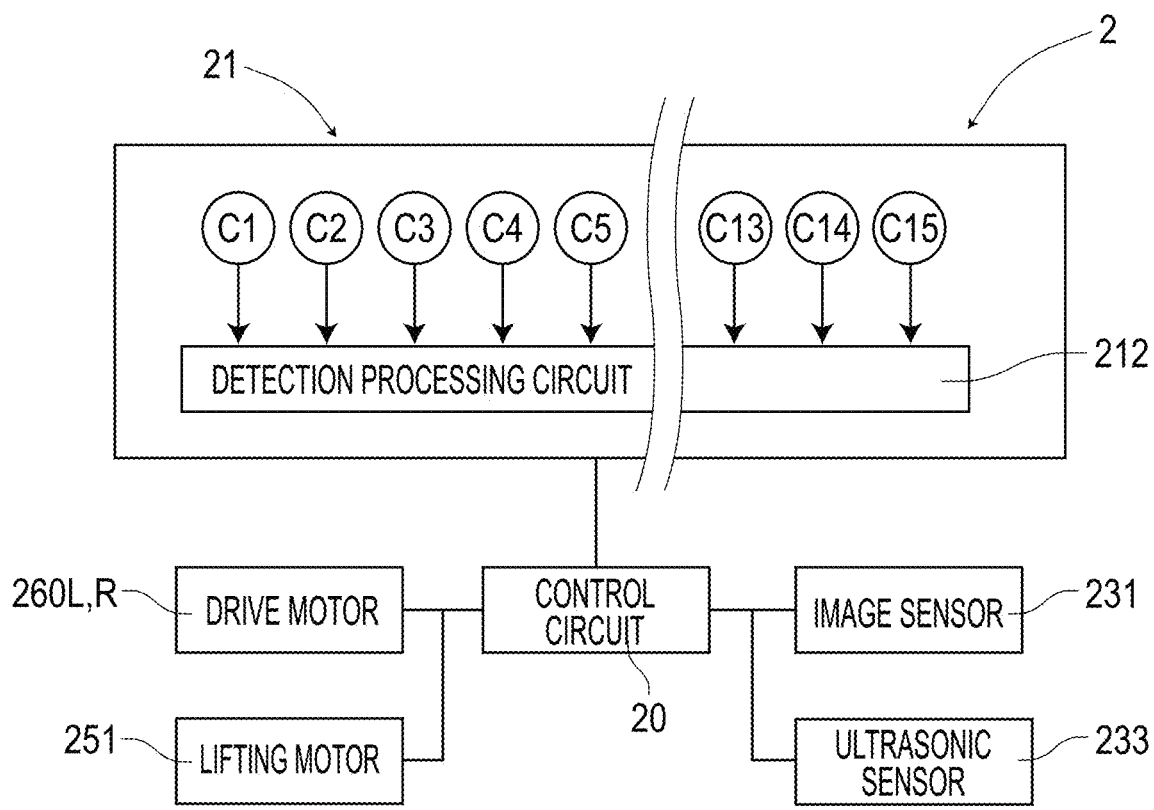
FIG. 6 is a block diagram depicting electrical configuration of the unattended carrier vehicle.

Unattended carrier vehicle 2 includes electrical configuration depicted in FIG. 6. Unattended carrier vehicle 2 includes sensor array 21 including magnetic sensors Cn, various sensors such as image sensor 231 and ultrasonic sensor 233, control circuit 20, and so forth. Control circuit 20 is a circuit that controls drive motors 260L and 260R which rotationally drive left and right driving wheels 26L and 26R, lifting motor 251 which lifts and declines coupling pin 2P, and so forth.

Control circuit 20 rotationally drives left and right driving wheels 26L and 26R individually, thereby moving unattended carrier vehicle 2. For example, if left and right driving wheels 26L and 26R are rotated at the same speed, unattended carrier vehicle 2 can be linearly moved. For example, if left and right driving wheels 26L and 26R are rotated in opposite directions, unattended carrier vehicle 2 can be rotated at that location.

Control circuit 20 controls the forwarding direction of unattended carrier vehicle 2 so as to suppress a lateral shift amount of unattended carrier vehicle 2 with respect to magnetic marker 10. According to this control, unattended carrier vehicle 2 can be moved so as to be along line 10L where magnetic markers 10 are arrayed. Furthermore, control circuit 20 performs speed control including stop control, in accordance with the result of detection of a surrounding obstacle by ultrasonic sensor 233 or image sensor 231.

Sensor array 21 is a rod-shaped sensor unit with a plurality of magnetic sensors Cn arrayed on a straight line. Sensor array 21 includes detection processing circuit 212 which processes a magnetic measurement value by each magnetic sensor Cn. Sensor array 21 is attached so as to be along a vehicle-width direction. As magnetic sensor Cn, for example, a highly-sensitive MI sensor which detects magnetism by using the known MI effect (Magneto Impedance Effect) or the like is suitable. The MI effect is an electromagnetic effect in which the impedance of a magneto-sensitive body such as, for example, an amorphous wire, sensitively changes in response to the external magnetic field.

Magnetic sensor Cn is a highly-sensitive sensor with a measurement range of magnetic flux density of ±50 milliteslas and a magnetic flux resolution of 0.2 microteslas in the measurement range. In view of these magnetic characteristics of the magnetic sensor, the inventors set 0.2 milliteslas or larger as a condition of a threshold value of a strength of magnetism (magnetic flux density) required for detecting magnetic marker 10 with high reliability. This threshold value of 0.2 milliteslas (one example of a predetermined strength) is a value defined by the inventors through their experiences and demonstrative experiments for many years so as to be able to reliably detect magnetic marker 10 even under an environment surrounded by production facilities also as magnetism generation sources.

In sensor array 21, each of magnetic sensors Cn (n is an integer of 1 to 15) is incorporated so that their directions of detecting magnetism match. Furthermore, sensor array 21 is attached to unattended carrier vehicle 2 so that each magnetic sensor Cn of sensor array 21 can detect a magnetic component in the vertical direction. The attachment height of sensor array 21 (magnetic sensors Cn) with reference to road surface 53S of passage 53 is 50 mm.

Detection processing circuit 212 included in sensor array 21 calculates a temporal difference between magnetic measurement values for each magnetic sensor Cn and also calculates a positional difference between magnetic measurement values of magnetic sensors Cn adjacent to each other among magnetic sensors Cn arrayed in the vehicle-width direction. The temporal difference between magnetic measurement values for each magnetic sensor Cn is an index indicating a magnetic gradient in the forwarding direction of unattended carrier vehicle 2. The positional difference between magnetic measurement values of magnetic sensors Cn adjacent to each other is an index indicating a magnetic gradient in the vehicle-width direction of unattended carrier vehicle 2.

Figure 7:
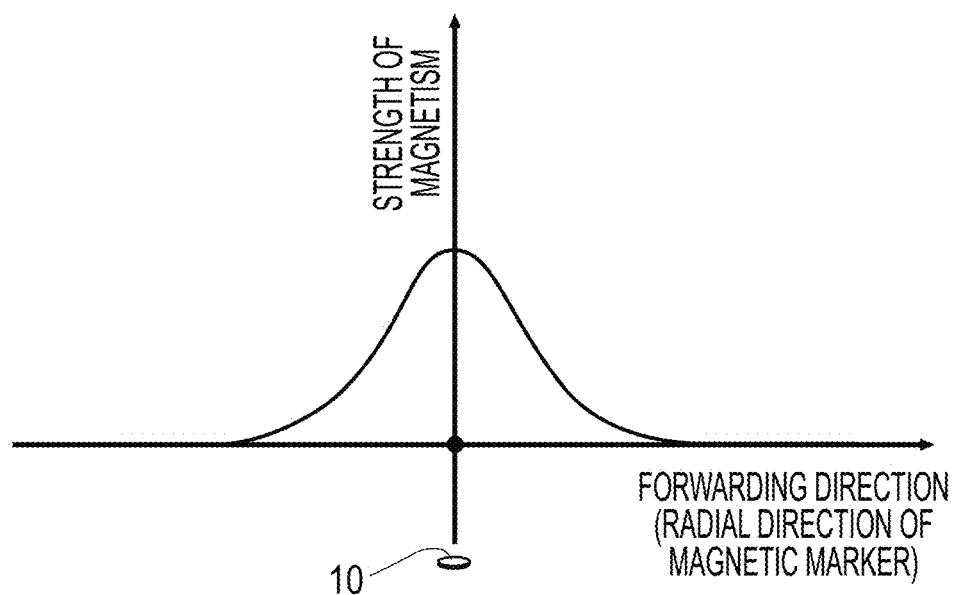
FIG. 7 is a graph representing a distribution representing changes in strength of a magnetic component in a vertical direction acting on a magnetic sensor while passing over the magnetic marker.

When unattended carrier vehicle 2 passes over magnetic marker 10, a distribution representing ideal changes of the magnetic measurement value in the vertical direction by a magnetic sensor passing directly above magnetic marker 10 (one example of the second distribution) is, as in FIG. 7, a magnetic distribution around the magnetic dipole close to a normal distribution with its peak coming directly above magnetic marker 10. The forwarding direction on the horizontal axis in the drawing is equivalent to the radial direction of magnetic marker 10. The vertical axis in the drawing represents strength of a magnetic component in the vertical direction acting on the magnetic sensor (magnitude of the magnetic measurement value by the magnetic sensor). The above-described ideal distribution means a distribution when magnetic marker 10 as a magnetism generation source is replaced by a magnetic dipole. When the magnetic sensor is sufficiently away from road surface 53S where magnetic marker 10 is laid, the distribution of strengths of magnetic components in the vertical direction acting on the magnetic sensor become close to the ideal distribution.

Figure 8:
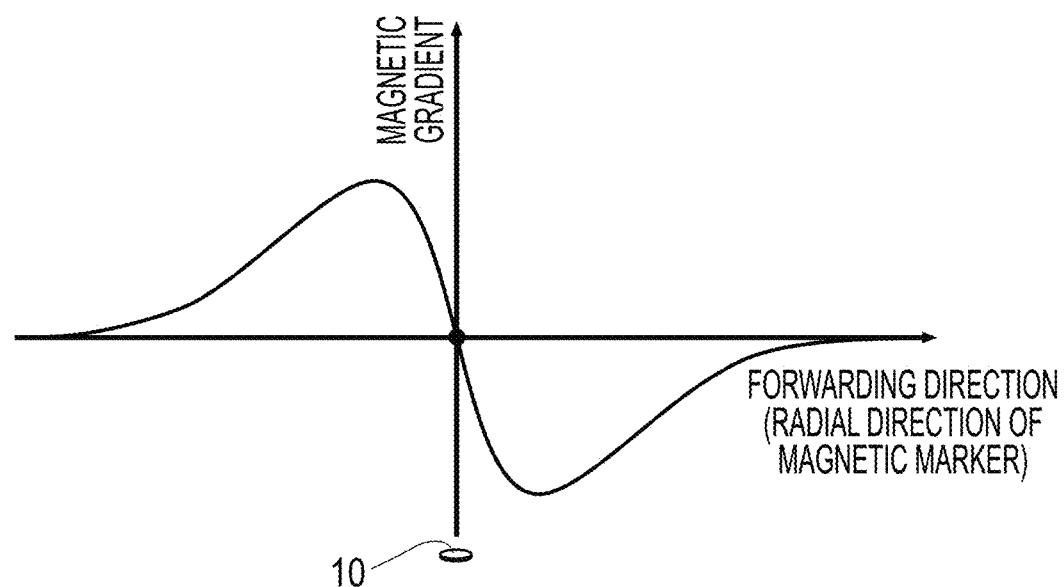
FIG. 8 is a graph representing changes of a magnetic gradient in a forwarding direction while passing over the magnetic marker.

Also, in the ideal distribution exemplarily depicted in FIG. 7, a magnetic gradient in the forwarding direction, which is a temporal difference between magnetic measurement values of each magnetic sensor Cn, becomes like a sinusoidal waveform as in FIG. 8, with its sign reversed depending on whether the magnetic sensor is positioned on a side before magnetic marker 10 or the magnetic marker is located at a position after passage over magnetic marker 10. The magnetic gradient in the forwarding direction when unattended carrier vehicle 2 passes directly above magnetic marker 10 changes so as to cross zero at the position directly above magnetic marker 10.

Detection processing circuit 212 (FIG. 6) included in sensor array 21 detects magnetic marker 10 by detecting a reverse of the sign of the magnetic gradient in the forwarding direction (FIG. 8). In the forwarding direction of unattended carrier vehicle (vehicle) 2, a position where the sign of the magnetic gradient in this forwarding direction is reversed is a position corresponding to the position directly above magnetic marker 10.

When sensor array 21 is positioned directly above magnetic marker 10, the sign of the above-described magnetic gradient in the vehicle-width direction is reversed depending on whether the magnetic sensor is positioned on a left side or a right side with respect to magnetic marker 10. For example, by detecting the reverse of the sign of the magnetic gradient in the vehicle-width direction, detection processing circuit 212 identifies the position of magnetic marker 10 in the vehicle-width direction. By identifying the position of magnetic marker 10 in the vehicle-width direction, detection processing circuit 212 measures a shift amount (lateral shift amount) of the vehicle in the vehicle-width direction with respect to magnetic marker 10.

Next, in magnetic marker system 1 of the present embodiment configured as described above, a designing method for setting specifications of magnetic marker 10 is described. In the designing method of the present embodiment, specifications of magnetic marker 10 are set in consideration of the range of the attachment height of the magnetic sensor varying depending on the type of vehicle.

For example, there are various types of vehicle such as unattended carrier vehicle 2 in accordance with their use purposes, and they are different in height of the bottom surface. Since sensor array 2 is attached to the bottom surface of the vehicle, the attachment height of the magnetic sensors varies in accordance with the height of the bottom surface of each vehicle. Also, the movement route of the vehicle in the factory is set for each vehicle, and the lowest ground height required for a vehicle side varies for each route. For example, the movement routes also include a route including a step difference. For a vehicle set with a movement route including a step difference, it is required to set a high attachment height of the magnetic sensors so as to avoid the possibility of interference of any magnetic sensor (sensor array) with the step difference before it happens. Due to these circumstances, in the configuration of the present embodiment, the range of the attachment height of the magnetic sensors assumed in each vehicle is set at 30 mm to 200 mm.

In the present embodiment, the specifications of magnetic marker 10 are set based on the magnetic characteristics of a magnet forming the magnetic marker. Thus, prior to description of the method of designing specifications of magnetic marker 10, the magnetic characteristics of the magnetic marker are first described with reference to FIG. 9 to FIG. 13. These drawings are those representing calculation results by computer simulations. Note that when the computer simulations are used, accuracy of the simulations has been confirmed in advance by demonstration experiments under part of simulation conditions.

Figure 9:
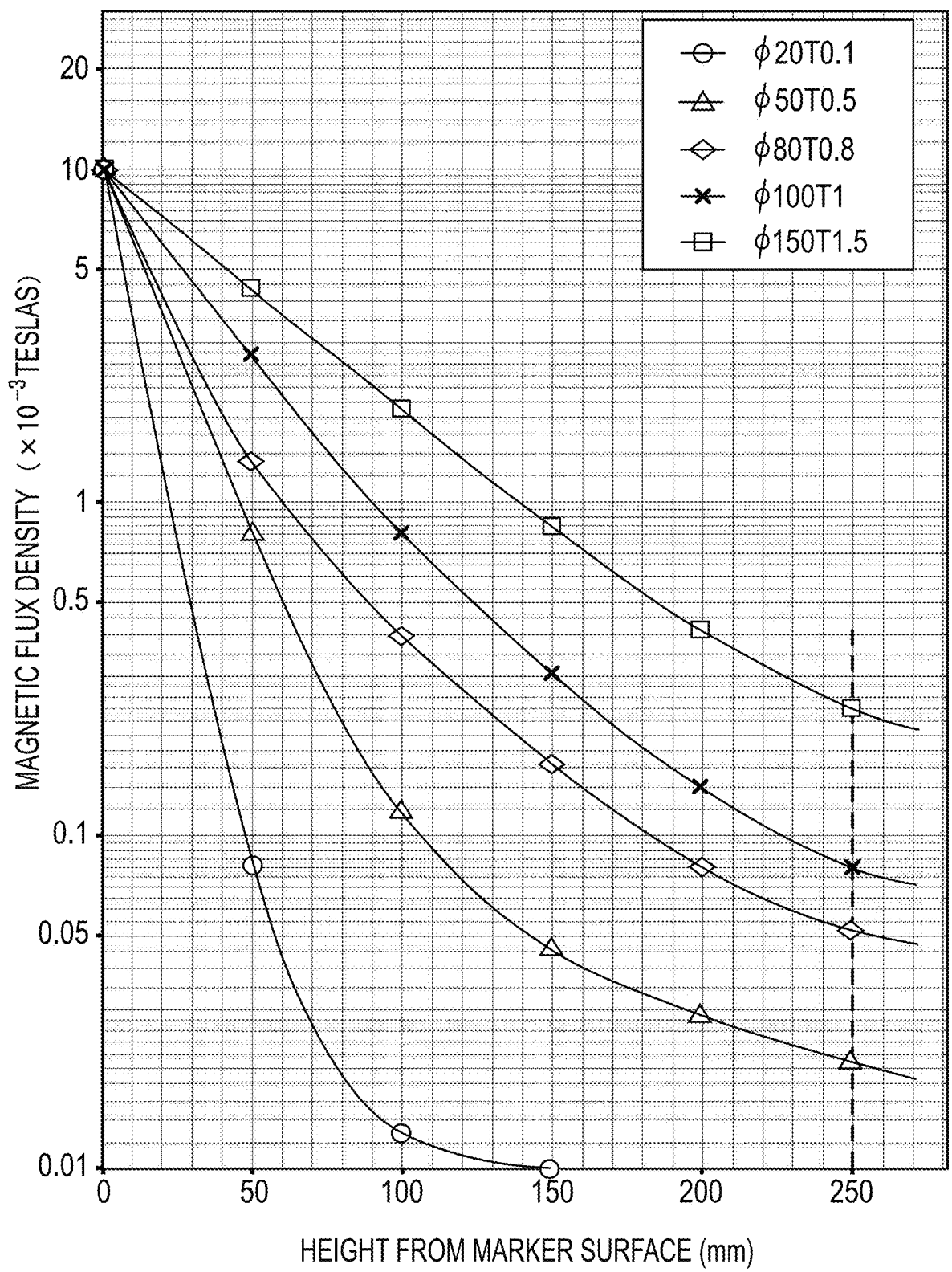
FIG. 9 is a graph representing a degree of attenuation in a height direction of magnetic flux density with which the magnetic marker acts.

FIG. 9 is a graph representing a degree of attenuation of the magnetic flux density in a height direction of magnetic markers of several types having the same magnetic flux density of the surface of magnetic marker 10 (surface of magnet sheet 10S) but different diameters. In legends in the drawing, the diameter and thickness of each magnetic marker are indicated for each plot type. For example, $\phi80T0.8$ indicates that the diameter is 80 mm and the thickness is 0.8 mm. The thickness of each magnetic marker is set so that each magnetic flux density of the surface is 10 milliteslas.

According to FIG. 9, the degree of attenuation of magnetic flux density in the height direction varies depending on the diameter of the magnetic marker, and it can be found that the degree of attenuation is suppressed more as the diameter is larger. That is, as the diameter, which is a specification as to size of the surface of the magnetic marker facing the magnetic sensor, is larger, it is possible to advantageously act on the magnetic sensors with stronger magnetism while suppressing the magnetic flux density of surface.

Figure 10:
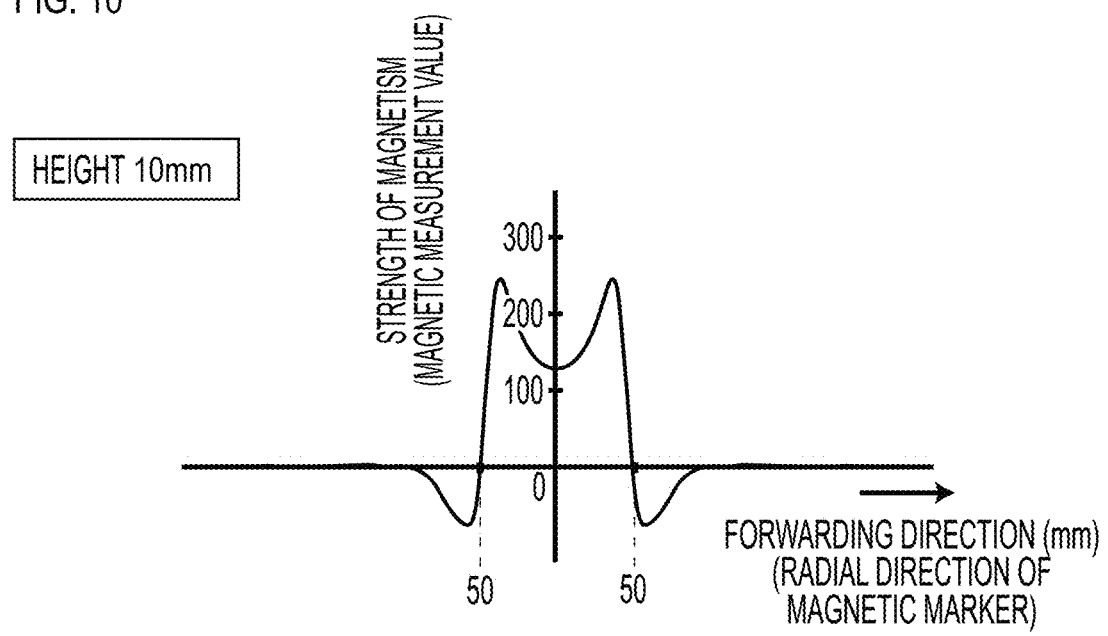
FIG. 10 is a graph representing a distribution of strengths of magnetic components in the vertical direction acting on a magnetic sensor having an attachment height of 10 mm while passing over the magnetic marker.
Figure 11:
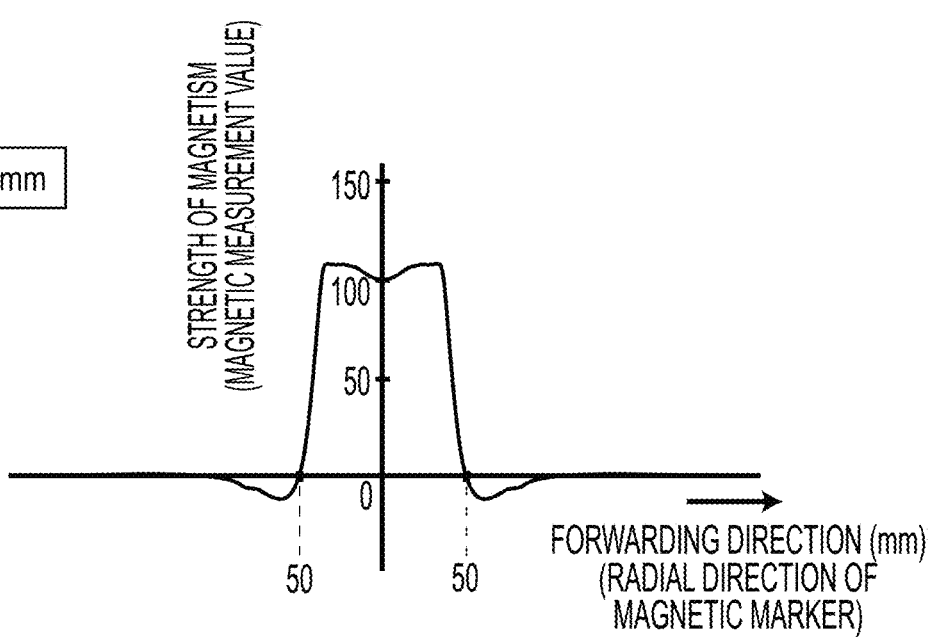
FIG. 11 is a graph representing a distribution of strengths of magnetic components in the vertical direction acting on a magnetic sensors having an attachment height of 20 mm while passing over the magnetic marker.
Figure 12:
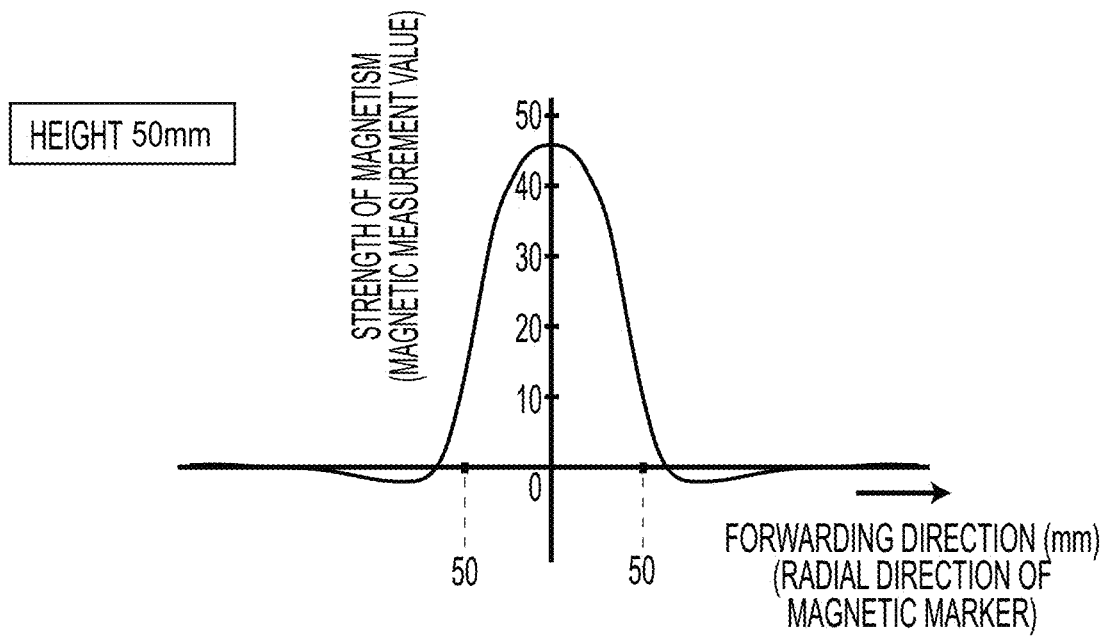
FIG. 12 is a graph representing a distribution of strengths of magnetic components in the vertical direction acting on a magnetic sensor having an attachment height of 50 mm while passing over the magnetic marker.

FIG. 10 to FIG. 12 are graphs each representing a distribution which represents changes of the magnetic measurement value in the vertical direction detected by the magnetic sensor when the vehicle passes over a magnetic marker having a diameter of 100 mm. The horizontal axis in these drawings represents the forwarding direction of the vehicle equivalent to the radial direction of the magnetic marker, and a zero point corresponds to a position directly above the magnetic marker. The distribution of the magnetic measurement values in each of FIG. 10 to FIG. 12 is a distribution of strengths of magnetism acting on the position at the attachment height of the magnetic sensor (magnetic components in the vertical direction) in the radial direction of the magnetic marker (one example of a first distribution).

In FIG. 10 to FIG. 12, the attachment height of the magnetic sensors varies. FIG. 10 represents a distribution when the attachment height of the magnetic sensor is 10 mm. FIG. 11 represents a distribution when the attachment height of the magnetic sensor is 20 mm. FIG. 12 represents a distribution when the attachment height of the magnetic sensor is 50 mm. In FIG. 10 to FIG. 12, due to the influence of the attachment height of the magnetic marker, differences in shape occur to the distributions of the magnetic measurement values in the vertical direction (distributions of strengths of the magnetic components in the vertical direction).

Based on the comparison among FIG. 10 to FIG. 12, it can be found that while the distribution of the magnetic measurement values in the vertical direction (one example of the first distribution) becomes closer to the ideal magnetic distribution around the magnetic dipole exemplarily depicted in FIG. 7 (one example of the second distribution) when the attachment height of the magnetic sensor is higher, the distribution of the magnetic measurement values in the vertical direction diverges from the ideal magnetic distribution around the magnetic dipole when the attachment height of the magnetic sensor is lower. In particular, in the waveform of FIG. 10 with the attachment height of 10 mm, a peak value, which is larger than the magnetic measurement value at the zero point corresponding to the position directly above the magnetic marker, appears at a position corresponding to the outer edge of the magnetic marker, that is, near each of positions 50 mm before and after the zero point.

When the distribution of the magnetic measurement values in the vertical direction diverges from the magnetic distribution around the magnetic dipole close to a normal distribution (refer to FIG. 7), the magnetic gradient in the forwarding direction does not exhibit a waveform (distribution) close to a sinusoidal waveform (refer to FIG. 8). With that, for the magnetic gradient in the forwarding direction, it is difficult to make a determination as to a zero-cross supposed to appear at a position corresponding to a position directly above the magnetic marker, and reliability of detection of the magnetic marker is impaired.

Note that the inventors have experimentally confirmed through simulation calculations, verification experiments, and so forth that the influence on accuracy of detection of magnetic marker 10 can be sufficiently suppressed if a correlation coefficient indicating a degree of normalized correlation (degree of approximation) between a distribution of strengths of magnetic components in the vertical direction (one example of the first distribution) and a magnetic distribution around the magnetic dipole close to a normal distribution as an ideal distribution (one example of the second distribution) is equal to or larger than 0.9. Thus, in the present embodiment, this correlation coefficient equal to or larger than 0.9 is set as a requirement specification on a magnetic sensor side.

Figure 13:
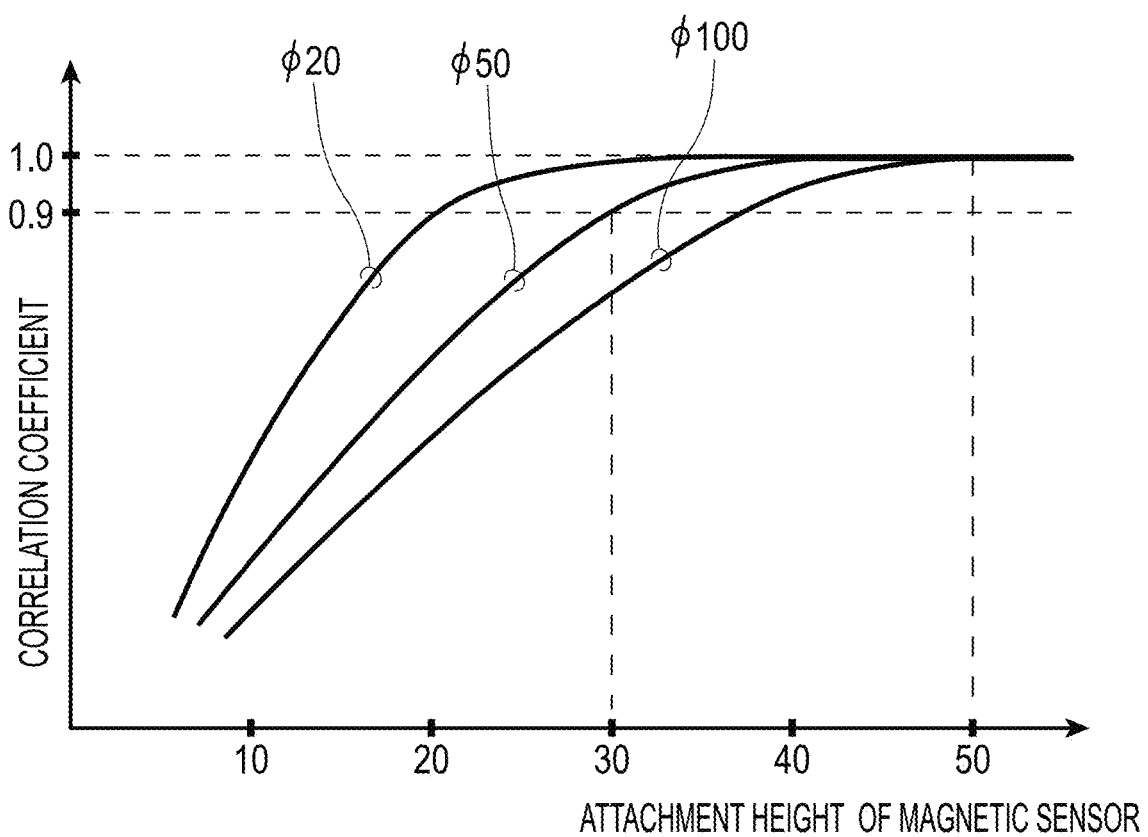
FIG. 13 is a graph representing a relation between a correlation coefficient indicating a degree of correlation between a distribution representing changes in strength of a magnetic component in the vertical direction acting on the magnetic sensor while passing over the magnetic marker and a magnetic distribution around a magnetic dipole in a direction equivalent to the radial direction of the magnetic marker, and the attachment height of the magnetic sensor.

FIG. 13 is a graph representing how the correlation coefficient by normalized correlation between the distribution of magnetic measurement values in the vertical direction while passing over the magnetic marker and the magnetic distribution around the magnetic dipole close to the normal distribution changes in accordance with the attachment height of the magnetic sensor. In the drawing, the results are depicted for the magnetic markers of three types having a diameter of 20 mm, 50 mm, and 100 mm. According to the drawing, it can be found that, in the magnetic marker of any size, the correlation coefficient decreases when the attachment height of the magnetic sensor is lower and the correlation coefficient gradually increases as the attachment height of the magnetic sensor is higher. For example, the attachment height of the magnetic sensor capable of achieving a correlation coefficient equal to or larger than 0.9 is higher as the diameter of the magnetic marker is larger.

Here, requirement specifications on the magnetic sensor side in magnetic marker system 1 of the present embodiment are summarized. As described above, the range of the attachment height of the magnetic sensor assumed in each vehicle (unattended carrier vehicle 2) is a range of 30 mm to 200 mm. When the magnetic sensor is at the minimum attachment height (30 mm), the degree of diversion of the distribution of strengths of magnetism acting on the magnetic sensor while passing over the magnetic marker from the ideal normal distribution becomes at the maximum. Thus, as described above, in the present embodiment, a requirement specification is set that the correlation coefficient indicating a degree of approximation between the distribution of strengths of magnetism acting on the magnetic sensor at the minimum attachment height and the magnetic distribution around the magnetic dipole close to the normal distribution is equal to or larger than 0.9 (one example of a predetermined coefficient value).

On the other hand, when the magnetic sensor is at the maximum attachment height (200 mm), there is a possibility that the strength of magnetism acting on the magnetic sensor from the magnetic marker is insufficient and reliability of detection of the magnetic marker is impaired. In consideration of a margin of safety for reliably detecting the magnetic marker and so forth, as described above, in the present embodiment, as a magnetic flux density that should act on the position at the maximum attachment height of the magnetic sensor, a requirement specification is set that the magnetic flux density equal to or larger than a predetermined strength, that is, 0.2 milliteslas.

The specifications of the magnetic marker forming a sheet shape having a diameter of 50 mm and a thickness of 2.6 mm and having a magnetic flux density Gs of the surface of 50 milliteslas in the present embodiment are specifications set in consideration of the requirement specifications on the magnetic sensor side as described above. A method of designing this magnetic marker system is described with reference to FIG. 14 and FIG. 15.

Figure 14:
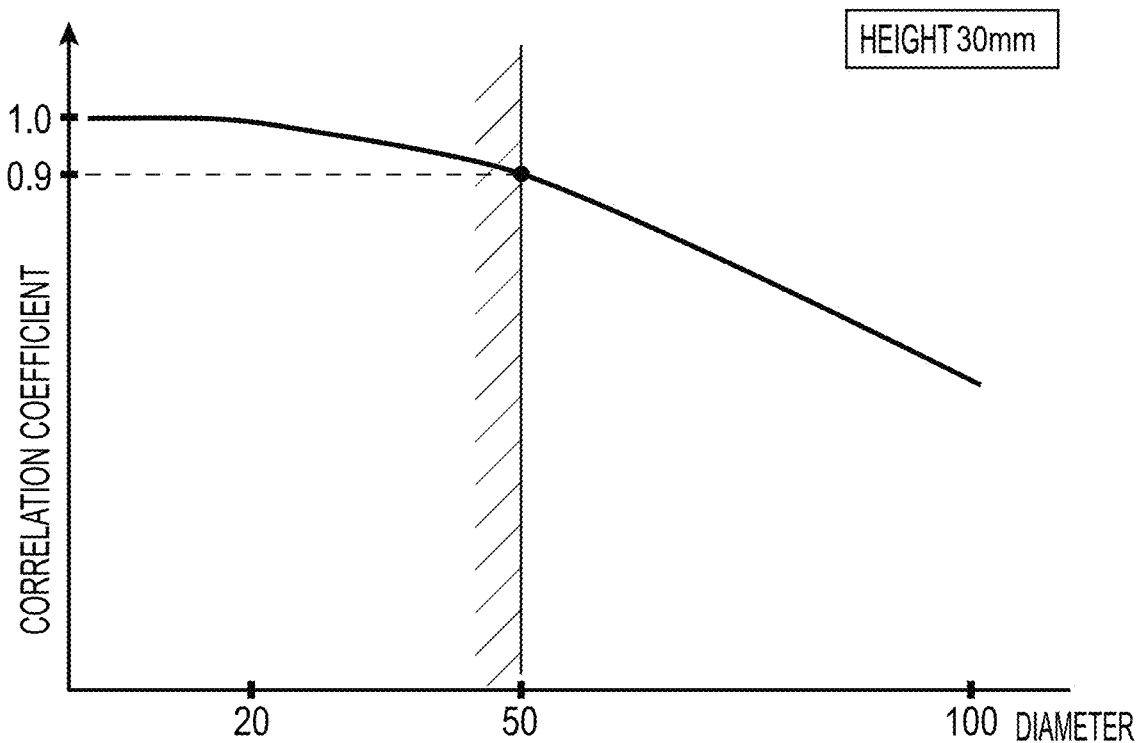
FIG. 14 is a graph representing a relation between a correlation coefficient indicating a degree of correlation between a distribution representing changes in strength of a magnetic component in the vertical direction acting on the magnetic sensor while passing over the magnetic marker and a magnetic distribution around the magnetic dipole in the direction equivalent to the radial direction of the magnetic marker, and the diameter of the magnetic marker.

FIG. 14 is a graph representing how the correlation coefficient by normalized correlation between the distribution representing changes in strength of a magnetic component in the vertical direction acting on the magnetic sensor while passing over the magnetic marker (one example of the first distribution) and the magnetic distribution around the magnetic dipole as the ideal distribution (one example of the second distribution) changes in accordance with the diameter of the magnetic marker. The attachment height of the magnetic sensor in the drawing is 30 mm. The attachment height of the magnetic sensor of 30 mm is the minimum attachment height with the range of the attachment height of 30 mm to 200 mm of the magnetic sensor in magnetic marker system 1 of the present embodiment.

According to FIG. 14, a gradually-decreasing tendency of the above-described correlation coefficient as the diameter of the magnetic marker increases can be clearly grasped. Also, when the attachment height of the magnetic sensor is 30 mm, it can be found that the correlation coefficient becomes below 0.9 when the diameter of the magnetic marker exceeds 50 mm. In the present embodiment, by taking these as grounds, 50 mm, which is the maximum diameter among diameters with which the above-described correlation coefficient is equal to or larger than 0.9 (one example of the predetermined coefficient value), is set as the size of the magnetic marker.

The reason for selecting the maximum diameter as described above resides in the magnetic characteristics of the magnetic marker described above with reference to FIG. 9. This is because, as the diameter is larger, the degree of attenuation of the magnetic flux density in the height direction is more suppressed, thereby allowing an increase in magnetic flux density acting on the maximum attachment height of the magnetic sensor. That is, setting the maximum diameter as the size of the magnetic marker is equivalent to setting the size (diameter) with which the strength of magnetism acting on the position of the maximum attachment height of the magnetic sensor.

Figure 15:
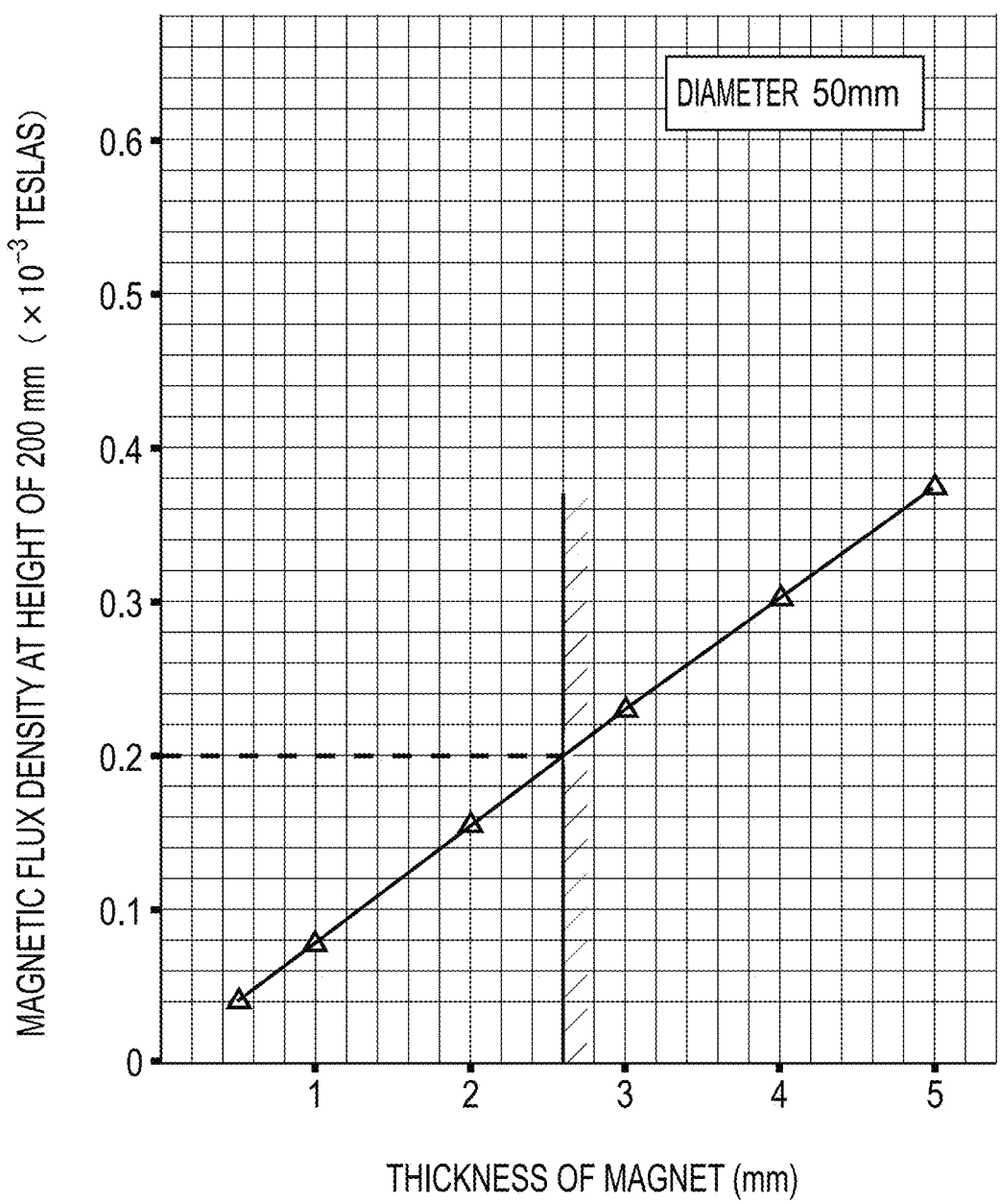
FIG. 15 is a graph representing a relation between the thickness of the magnetic marker and magnetic flux density acting on a height of 200 mm.

FIG. 15 represents how the magnetic flux density acting on the position at a height of 200 mm changes in accordance with the thickness of a magnetic marker having a diameter of 50 mm. Note that the attachment height of 200 mm of the magnetic sensor is the maximum attachment height with the range of the attachment height of 30 mm to 200 mm of the magnetic sensor in magnetic marker system 1 of the present embodiment. Note that the thickness of the magnetic marker is one example of a dimension of the magnetic marker in the vertical direction.

According to FIG. 15, it can be found that the thickness of the magnetic marker (magnet sheet) and the magnetic flux density acting on the position at the height of 200 mm have an approximately proportional relation. Also, when the thickness of the magnetic marker is 2.6 mm, the magnetic flux density acting on the position at the height of 200 mm is 0.2 milliteslas, which is defined as a predetermined strength as described above. From this, in the present embodiment, the thickness of the magnetic marker (magnet sheet) having a diameter of 50 mm is set at 2.6 mm. Note that the thickness may be set at 3 mm. If the thickness is 3 mm, which is thicker than 2.6 mm, the magnetic flux density acting on the position at the height of 200 mm is equal to or larger than 0.2 milliteslas, which is the predetermined strength. However, when the magnetic marker is thickened, the magnetic force of the surface is intensified, so it is not preferable to excessively increase the thickness.

The specifications of the magnetic marker in magnetic marker system 1 of the present embodiment are set by the designing method as described above. According to the above-described designing method, in magnetic marker system 1 in which the attachment height of the magnetic sensor varies depending on the vehicle type, the specifications of the magnetic marker can be appropriately set.

In the present embodiment, the specifications of the magnetic marker are set based on the requirement specifications on the magnetic sensor side that the above-described correlation coefficient at the minimum attachment height of the magnetic sensor is equal to or larger than 0.9 and the magnetic flux density at the maximum attachment height is equal to or larger than 0.2 milliteslas. The requirement specifications on the magnetic sensor side regarding the correlation coefficient at the minimum attachment height depend on the detection performance of an algorithm for detecting the magnetic marker, and any specification is preferably set in accordance with the detection performance. Also, the value of the magnetic flux density at the maximum attachment height depends on the way of thinking a margin of safety in detecting the magnetic marker, the detection performance of the magnetic sensor, and so forth, and the value exemplarily described is merely an example.

Note that, in the present embodiment, the specifications of the magnetic marker are set on the basis of a combination of the degree of approximation of the distribution of strengths of the magnetic components in the vertical direction acting on the position at the minimum attachment height to the ideal distribution and the strength of magnetism acting on the magnetic sensor at the maximum attachment height. That is, in the present embodiment, among diameters with which the above-described correlation coefficient is equal to or larger than 0.9, the maximum diameter with the strongest strength of magnetism acting on the position at the maximum attachment height is set as a size specification of the surface of the magnetic marker.

In place of this, the size specification of the surface of the magnetic marker may be set based on the degree of approximation described above. For example, as the degree of approximation, it is preferably set a specification of the magnetic marker so that the above-described correlation coefficient is equal to or larger than 0.9 and smaller than 0.95, or set a specification of the magnetic marker with this correlation coefficient being 0.9.

For example, in the case of FIG. 14, the correlation coefficient equal to or larger than 0.9 and smaller than 0.95 generally corresponds to a range of the diameter of the magnetic marker of 35 mm to 50 mm. If a diameter corresponding to a correlation coefficient of 1 is selected, the possibility that a magnetic marker having a too small diameter is included in candidates is high. On the other hand, as described above, if a range of correlation coefficients (one example of a range of predetermined coefficient values) is set in a region in which the correlation coefficient is below 1, a magnetic marker having a too small diameter can be excluded from candidates.

Alternatively, based on the graph of FIG. 14, a diameter with a correlation coefficient being 0.9 (one example of the predetermined coefficient value) may be selectively set. As in the drawing, changes in the correlation coefficient in accordance with the diameter of the magnetic marker are changes decreasing downward to the right in a range in which the correlation coefficient is under 1. Therefore, selecting a diameter corresponding to the predetermined coefficient value such as 0.9 under 1 corresponds to selecting a magnetic marker with a correlation coefficient being equal to or larger than 0.9 and having the largest diameter.

In the present embodiment, the sheet-shaped magnet sheet or magnetic marker is exemplarily described, but the shape of the magnetic marker is not limited to the sheet shape. The shape may be a columnar shape. In the present embodiment, a circular shape is exemplarily described as the shape of the surface of the magnetic marker facing the magnetic sensor. The shape of this surface of the magnetic marker is not limited to the circular shape. In place of the circular shape, the shape may be a polygonal shape such as a triangle, quadrangle, or hexagon, may be a rectangular shape, or may be a cross shape or the like with two rectangular shapes crossing each other.

In the present embodiment, the magnetic sensor having sensitivity in the vertical direction is exemplarily described. In place of this, a magnetic sensor having sensitivity in biaxial directions orthogonal to each other or in triaxial directions orthogonal to one another may be adopted. For example, magnetic measurement values by the magnetic sensor having sensitivity in the forwarding direction exhibit a change curve similar to that of FIG. 8 while passing over the magnetic marker. Also, for example, when a sensor array with a plurality of magnetic sensors having sensitivity in the vehicle-width direction arrayed in the vehicle-width direction is positioned directly above any magnetic marker, the approximate curve of magnetic measurement values in the vehicle-width direction of each magnetic sensor exhibits a sinusoidal waveform including a zero-cross. By identifying the position of the zero-cross, a lateral shift amount with respect to the magnetic marker can be grasped.

While the MI sensor using the MI element is exemplarily described as a magnetic sensor, in place of this, a flux gate sensor or a TMR sensor may be adopted as a magnetic sensor. When two or more magnetic sensors are used, a combination of two types of more among the MI sensor, the flux gate sensor, and the TMR sensor may be adopted.

The magnetic material of the magnet sheet configuring the magnetic marker and the type of the magnet are not limited to those in the present embodiment. As a magnetic material and a type of the magnet, any of various materials and types can be adopted. It is preferable to selectively determine an appropriate magnetic material and type in accordance with the magnetic specifications, environmental specifications, and so forth required for the magnetic marker.

The present embodiment is an example of a system for vehicles moving in a factory. The configuration of the present embodiment can be applied also to vehicles moving on public roads. Furthermore, the configuration of the present embodiment may be applied to a system such as BRT (Bus Rapid Transit). The designing method of the present embodiment can be generally applied to various systems using magnetic markers.

Note in the present embodiment that the specifications of the magnetic marker are selectively determined by using the results of computer simulations. When the computer simulations are used, simulation accuracy has been confirmed in advance by demonstration experiments under part of simulation conditions. Also, as for the magnetic marker, it has been confirmed by demonstration experiments that magnetic characteristics close to the results of the computer simulations can be obtained.

The ideal magnetic distribution for finding a correlation coefficient (magnetic distribution around the magnetic dipole close to the normal distribution exemplarily depicted in FIG. 7) may be a distribution found by a computer simulator, or may be a distribution of actual measurement values obtained by measurement in advance in a laboratory or the like in which experiment conditions are controlled to be almost ideal. As for the magnetic distribution for finding a correlation with the ideal magnetic distribution, a distribution by a computer simulation may be adopted, or a distribution of actual measurement values obtained by measurement in a laboratory or the like.

In the foregoing, specific examples of the present invention are described in detail as in the embodiment, these specific examples merely disclose examples of technology included in the scope of the claims. Needless to say, the scope of the claims should not be restrictively construed based on the configuration, numerical values, and so forth of the specific examples. The scope of the claims includes techniques acquired by variously modifying, changing, or combining as appropriate the above-described specific examples by using known techniques, knowledge of a person skilled in the art, and so forth.

REFERENCE SIGNS LIST

1 magnetic marker system
10 magnetic marker
10S magnet sheet
2 unattended carrier vehicle (vehicle)
21 sensor array
Cn magnetic sensor
4 carrier cage
53 passage

The invention claimed is:

1. A magnetic marker system in which a magnetic marker as an individual-piece magnet or a columnar-shaped magnet is laid on or in a road surface forming a surface of a traveling road so as to be able to be detected by a vehicle including a magnetic sensor, with an attachment height of the magnetic sensor with reference to the road surface varying depending on a type of the vehicle, wherein a specification of the magnetic marker as the individual-piece magnet is set based on a degree of approximation between a first distribution representing a distribution of strengths of magnetism in a radial direction of the magnetic marker acting on a position at a minimum attachment height in a range of attachment heights of the magnetic sensor assumed in respective vehicles and a second distribution representing a distribution of strengths of magnetism in a direction equivalent to the radial direction of the magnetic marker acting on the position at the minimum attachment height when the magnetic marker as a magnetism generation source is replaced by a magnetic dipole.

2. The magnetic marker system in claim 1, wherein the first distribution and the second distribution are distributions of strengths of magnetic components in a vertical direction, and the second distribution is a magnetic distribution around the magnetic dipole.

3. The magnetic marker system in claim 1, wherein the specification of the magnetic marker as the individual-piece magnet is set based on a combination of the degree of approximation and a strength of magnetism acting on a position at a maximum attachment height in the range of the attachment heights of the magnetic sensor directly above the magnetic marker.

4. The magnetic marker system in claim 1, wherein the degree of approximation is a correlation coefficient between the first distribution and the second distribution.

5. The magnetic marker system in claim 4, wherein, as the specification related to a size of a surface of the magnetic marker facing the magnetic sensor, the size is set in which the correlation coefficient equal to or larger than a predetermined coefficient value or exceeds the predetermined coefficient value and a strength of magnetism acting on a position at a maximum attachment height in the range of the attachment heights of the magnetic sensor is at maximum directly above the magnetic marker.

6. The magnetic marker system in claim 1, wherein, as the specification of a dimension of the magnetic marker in a vertical direction, the dimension is set in which the strength of magnetism acting on the position at the maximum attachment height is equal to or larger than a predetermined strength or exceeds the predetermined strength.

7. The magnetic marker system in claim 1, wherein the magnetic marker is in a circular shape.

8. A magnetic marker system designing method of, when a magnetic marker as an individual-piece magnet or a columnar-shaped magnet is laid on or in a road surface forming a surface of a traveling road so as to be able to be detected by a vehicle including a magnetic sensor, setting a specification of the magnetic marker, with an attachment height of the magnetic sensor with reference to the road surface varying depending on a type of the vehicle, the method comprising setting the specification of the magnetic marker as the individual-piece magnet is set based on a degree of approximation between a first distribution representing a distribution of strengths of magnetism in a radial direction of the magnetic marker acting on a position at a minimum attachment height in a range of attachment heights of the magnetic sensor assumed in respective vehicles and a second distribution representing a distribution of strengths of magnetism in a direction equivalent to the radial direction of the magnetic marker acting on the position at the minimum attachment height when the magnetic marker as a magnetism generation source is replaced by a magnetic dipole.

9. The magnetic marker system designing method in claim 8, wherein the first distribution and the second distribution are distributions of strengths of magnetic components in a vertical direction, and the second distribution is a magnetic distribution around the magnetic dipole.

10. The magnetic marker system designing method in claim 8, wherein the specification of the magnetic marker as the individual-piece magnet is set based on a combination of the degree of approximation and a strength of magnetism acting on a position at a maximum attachment height in the range of the attachment heights of the magnetic sensor directly above the magnetic marker.

11. The magnetic marker system designing method in claim 8, wherein the degree of approximation is a correlation coefficient between the first distribution and the second distribution.

12. The magnetic marker system designing method in claim 11, wherein, as the size specification related to a size of a surface of the magnetic marker facing the magnetic sensor, the size is set in which the correlation coefficient equal to or larger than a predetermined coefficient value or exceeds the predetermined coefficient value and a strength of magnetism acting on a position at a maximum attachment height in the range of the attachment heights of the magnetic sensor is at maximum directly above the magnetic marker.

13. The magnetic marker system designing method in claim 11, wherein, as the specification related to a size of a surface of the magnetic marker facing the magnetic sensor, the size is set in which the correlation coefficient belongs to a range of predetermined coefficient values or the correlation coefficient is any of the predetermined coefficient values.

14. The magnetic marker system designing method in claim 8, wherein, as the specification of a dimension of the magnetic marker in a vertical direction, the dimension is set in which a strength of magnetism acting on the position at the maximum attachment height is equal to or larger than a predetermined strength or exceeds the predetermined strength.

15. The magnetic marker system designing method in claim 8, wherein the magnetic marker is in a circular shape.

16. The magnetic marker system in claim 3, wherein the degree of approximation is a correlation coefficient between the first distribution and the second distribution.

17. The magnetic marker system in claim 16, wherein, as the specification related to a size of a surface of the magnetic marker facing the magnetic sensor, the size is set in which the correlation coefficient equal to or larger than a predetermined coefficient value or exceeds the predetermined coefficient value and a strength of magnetism acting on a position at a maximum attachment height in the range of the attachment heights of the magnetic sensor is at maximum directly above the magnetic marker.

18. The magnetic marker system designing method in claim 9, wherein the specification of the magnetic marker as the individual-piece magnet is set based on a combination of the degree of approximation and a strength of magnetism acting on a position at a maximum attachment height in the range of the attachment heights of the magnetic sensor directly above the magnetic marker.

19. The magnetic marker system designing method in claim 10, wherein, as the specification of a dimension of the magnetic marker in a vertical direction, the dimension is set in which a strength of magnetism acting on the position at the maximum attachment height is equal to or larger than a predetermined strength or exceeds the predetermined strength.

20. The magnetic marker system designing method in claim 12, wherein, as the specification of a dimension of the magnetic marker in a vertical direction, the dimension is set in which a strength of magnetism acting on the position at the maximum attachment height is equal to or larger than a predetermined strength or exceeds the predetermined strength.

* * * * *